US006391771B1

United States Patent
Naik et al.

(10) Patent No.: US 6,391,771 B1
(45) Date of Patent: May 21, 2002

(54) INTEGRATED CIRCUIT INTERCONNECT LINES HAVING SIDEWALL LAYERS

(75) Inventors: Mehul B. Naik, San Jose; Suketu A. Parikh, Santa Clara, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/121,236

(22) Filed: Jul. 23, 1998

(51) Int. Cl.$^7$ .............................................. H01L 21/44
(52) U.S. Cl. ...................... 438/653; 438/652; 438/654; 438/687; 438/669; 438/671; 438/672; 438/674; 438/675; 438/696; 438/622; 257/751; 257/762
(58) Field of Search .................... 438/687, 652–654, 438/669–671, 672–674, 675, 696; 257/750–761

(56) References Cited

U.S. PATENT DOCUMENTS

| 5,164,332 A | * 11/1992 | Kumar ........................ 437/198 |
| 5,354,711 A | 10/1994 | Heitzmann et al. .......... 437/182 |
| 5,430,328 A | * 7/1995 | Hsue ............................ 257/750 |
| 5,592,024 A | * 1/1997 | Aoyama et al. ............. 257/751 |
| 5,612,254 A | * 3/1997 | Mu et al. ..................... 437/195 |
| 5,614,765 A | 3/1997 | Avanzino et al. ............ 257/774 |
| 5,651,855 A | 7/1997 | Dennison et al. ......... 156/636.1 |
| 5,691,238 A | 11/1997 | Avanzino et al. ............ 437/195 |
| 5,705,430 A | 1/1998 | Avanzino et al. ............ 437/195 |
| 5,726,100 A | 3/1998 | Givens ........................ 438/702 |
| 5,739,579 A | 4/1998 | Chiang et al. ............... 257/635 |
| 5,741,626 A | 4/1998 | Jain et al. .................... 430/314 |
| 5,843,839 A | * 12/1998 | Ng .............................. 438/637 |
| 5,897,369 A | 4/1999 | Jun .............................. 438/629 |
| 5,976,975 A | * 11/1999 | Joshi et al. .................. 438/672 |
| 6,090,710 A | * 7/2000 | Andricacos et al. ........ 437/687 |
| 6,143,658 A | * 11/2000 | Donnelly, Jr. et al. ...... 438/687 |

FOREIGN PATENT DOCUMENTS

| EP | 0680085 A | 11/1995 | ......... H01L/21/768 |
| EP | 0911697 A | 4/1999 | ............. G03F/1/00 |

OTHER PUBLICATIONS

U.S. application No. 08/987,219, Naik, filed Dec. 04, 1997.

* cited by examiner

Primary Examiner—Steven Loke
Assistant Examiner—Nitin Parekh
(74) Attorney, Agent, or Firm—Albert J. Dalhusien

(57) ABSTRACT

The present invention provides Cu lines which are enclosed within Cu diffusion barrier layers, for IC structures such as semiconductor devices. The Cu lines (310) have conventional top (316) and bottom (318) Cu diffusion barrier layers and novel sidewall layers (324 and 326) comprising Cu diffusion barrier materials. The present invention also provides for conductive interconnect lines for semiconductor devices which compensate partly or completely for a misalignment between the line etch pattern and the underlying contact element, such as a via plug. The misalignment tolerant line (430) is formed by fabricating novel sidewalls (438 and 440) on the line wherein the sidewalls have a thickness which equals or exceeds the width of the gap (431) which is caused by the misalignment. The misalignment tolerant line compensates for the misalignment gap and thereby prevents etching a trench in the contact element. Trench formation is reduced rather than prevented when the sidewall is thinner than the width of the misalignment gap. In additional embodiments, manufacturing systems (510) are provided for fabricating the structures of the present invention. These systems include a controller (500) which is adapted for interacting with a plurality of fabrication stations (520, 522, 524, 526 and 528).

18 Claims, 7 Drawing Sheets

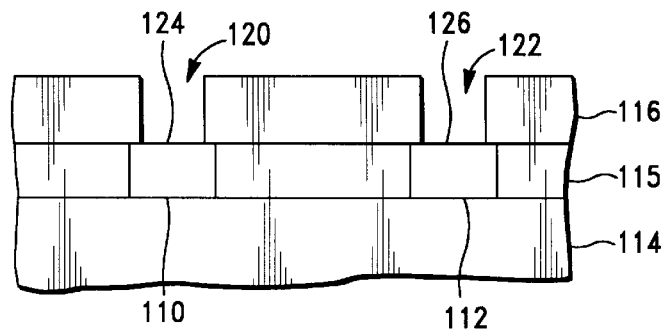
FIG.—1A
(PRIOR ART)
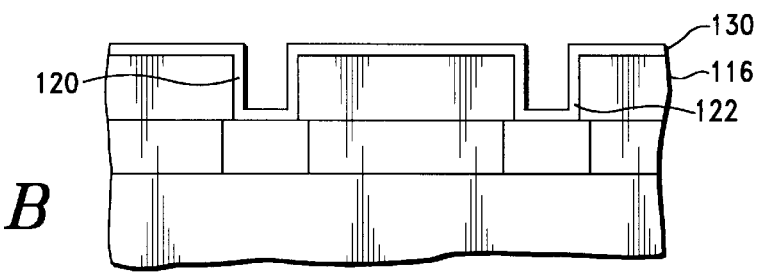
FIG.—1B
(PRIOR ART)
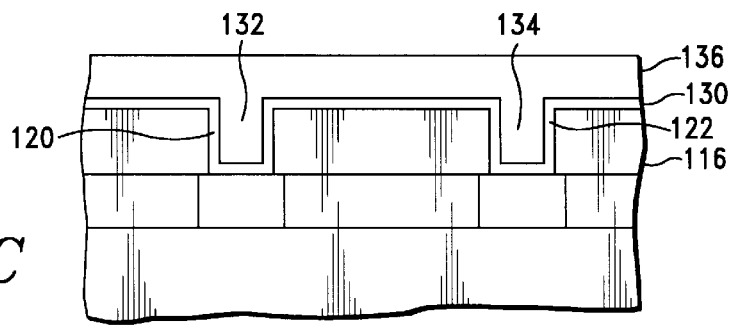
FIG.—1C
(PRIOR ART)
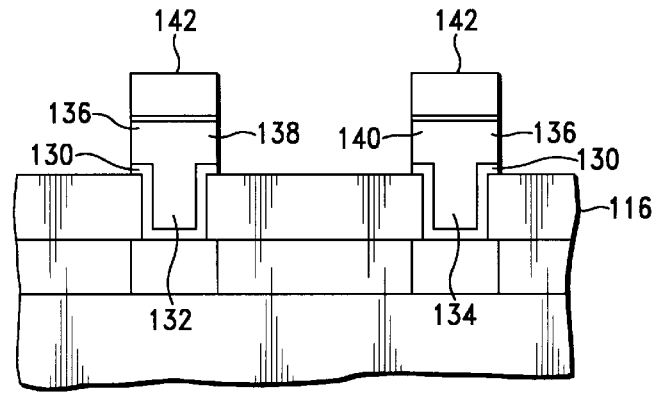
FIG.—1D
(PRIOR ART)

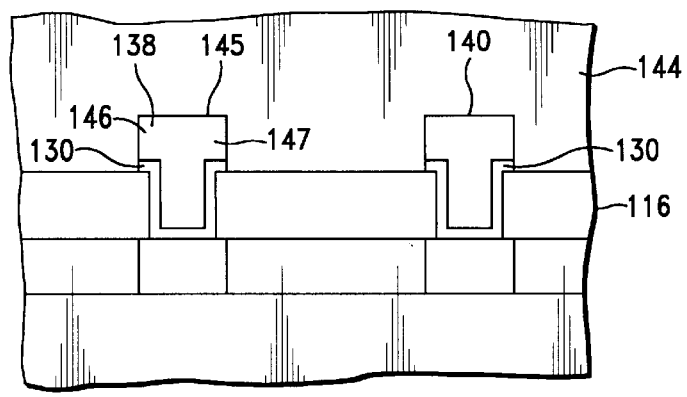
FIG.—1E
(PRIOR ART)
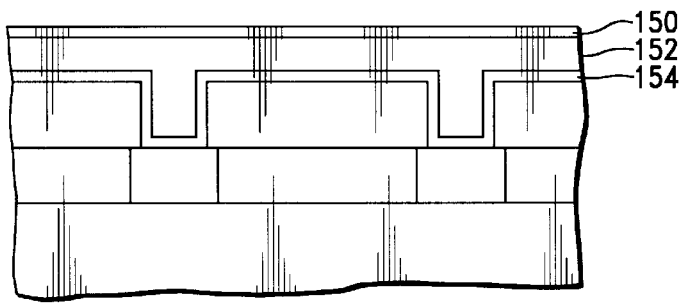
FIG.—1F
(PRIOR ART)
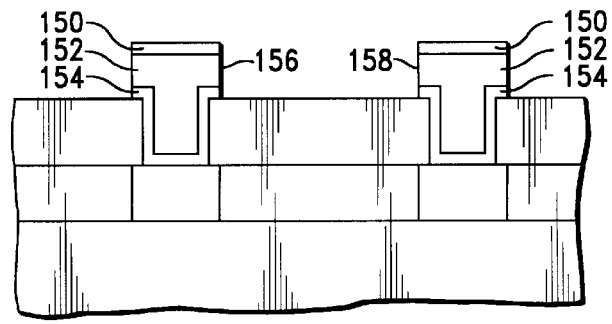
FIG.—1G
(PRIOR ART)

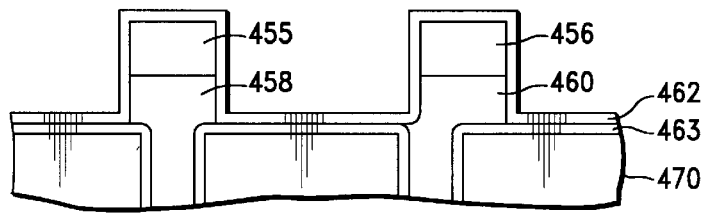
FIG.—4F
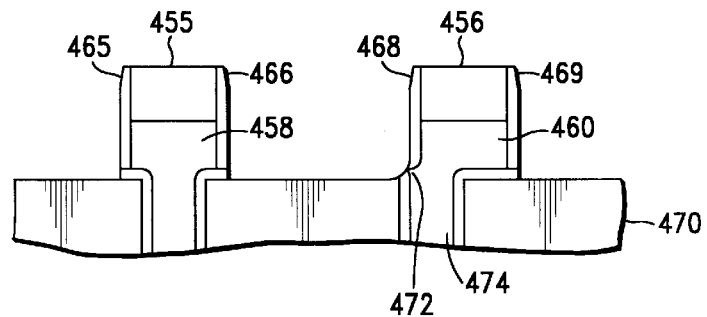
FIG.—4G

US 6,391,771 B1

INTEGRATED CIRCUIT INTERCONNECT LINES HAVING SIDEWALL LAYERS

FIELD OF THE INVENTION

The present invention relates to the fabrication of semiconductor device interconnect lines having diffusion barrier sidewalls and to the fabrication of semiconductor interconnect lines having sidewalls which compensate for misalignment between a line pattern and an underlying contact.

BACKGROUND OF THE INVENTION

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Advances in semiconductor materials and processing techniques have resulted in reducing the overall size of the IC while increasing the number of circuit elements. Additional miniaturization is highly desirable for improved IC performance and cost reduction. Interconnects provide the electrical connections between the various electronic elements of an IC and they form the connections between these elements and the device's external contact elements, such as pins, for connecting the IC to other circuits. Typically, interconnect lines form the horizontal connections between the electronic circuit elements while conductor filled vias form the vertical connections between the electronic circuit elements, resulting in layered connections.

The materials and dimensions of the interconnect lines are important for the performance and cost of present and future highly miniaturized IC devices. Typically, low resistance metals such as Al, Al/Cu alloys (i.e. alloys predominantly containing Al) and W find widespread use as interconnect line materials. Compared with these materials, Cu and Cu alloys (i.e. alloys predominantly containing Cu) have a lower resistance and are thus more desirable materials for interconnect lines. However, Cu is known to diffuse from the line into the device, causing malfunction or failure.

Conventional fabrication techniques for Cu or Cu alloy interconnect lines are illustrated in FIGS. 1A–1G. As shown in FIG. 1A, one or more interconnects, such as lines 110 and 112, are formed on a semiconductor substrate 114 in a gapfill insulator 115. One or more via holes such as 120 and 122 (FIG. 1A) are formed in insulating layer 116. Bottoms 124 and 126 of via holes 120 and 122 expose the top surface of interconnects 110 and 112 respectively. As shown in FIG. 1A, interconnects 110 and 112 are interposed between semiconductor substrate 114 and via holes 120 and 122 respectively. Alternately, via holes such as 120 and 122 can be in direct contact with a semiconductor substrate, such as a semiconductor material or other electronic elements. As shown in FIGS. 1A–1G, insulator 115 is deposited between interconnects 110 and 112. Alternately, insulator 115 can also be deposited on interconnects 110 and 112 in which case the via holes need to be formed through insulator 115 in order to expose the surface of the interconnects. Also, insulators 115 and 116 may comprise the same material.

A Cu barrier layer 130 which provides a barrier to Cu diffusion is deposited on the inside surfaces of via holes 120 and 122, and on the exposed surface of insulating layer 116, see FIG. 1B. Layer 130 can also function as an adhesion promoter. As shown in FIG. 1C, Cu or Cu alloy via plugs 132 and 134 are formed in lined via holes 120 and 122 respectively. A Cu or Cu alloy layer 136 is deposited on via plugs 132 and 134 and on layer 130 which extends on the surface of insulator layer 116. Cu lines 138 and 140 (FIG. 1D) are patterned by positioning a photo mask, a hard mask 142 or a combination of a photo and a hard mask on layer 136. This is followed by anisotropic etching of layers 136 and 130, to completely remove any metal between Cu lines 138 and 140. As depicted in FIG. 1E, mask 142 is removed and a dielectric layer 144 is deposited on lines 138, 140 and on the exposed surface of layer 116. Lines 138 and 140 are provided with a Cu diffusion barrier layer only at the bottom surface of each line (i.e. the surface of the line facing towards the semiconductor substrate). The top surface 145 and side surfaces 146 and 147 of lines 138 and 140 are in direct contact with dielectric layer 144, thus allowing Cu diffusion into layer 144 and subsequently into other components of the device.

An alternate conventional process (not shown) involves Cu plug fill, followed by removal of excess Cu, such that Cu is present only in the via. This is followed by the deposition of consecutive layers of barrier material, Cu or Cu alloy and barrier layer. The layer stack is then etched to form a Cu or Cu alloy line having top and bottom barrier layers. This technique does not provide side barrier layers.

An additional alternate conventional process for fabricating Cu or Cu alloy lines is illustrated in FIG. 1F showing a structure similar to the structure of FIG. 1C but having an additional top layer 150 comprising a Cu barrier material, which is deposited on Cu or Cu alloy layer 152. Layer 154 of the structure shown in FIG. 1F is a Cu barrier layer similar to barrier layer 130 of FIG. 1C. Cu lines 156 and 158 (FIG. 1G) are fabricated by anisotropic etching similar to the process described in connection with FIG. 1D except that the structure illustrated in FIG. 1G requires anisotropic etching of top Cu barrier layer 150 in addition to anisotropic etching of Cu layer 152 and Cu barrier layer 154. As shown in FIG. 1G, the top Cu barrier layer 150 provides a barrier against Cu diffusion through the top surface of lines 156 and 158 but this structure does not prevent Cu diffusion through the side surfaces of lines 156 and 158.

IC fabricating techniques which involve the alignment between an interconnect line and an underlying contact, such as a via plug, are very important for IC performance. A relatively small misalignment between the line and the underlying contact can cause trench formation in the contact, resulting in reduced IC yield and reduced reliability. The commonly used Cu or Cu alloy fabrication techniques for forming lines on vias, as illustrated in FIGS. 1A–1G, can also be used for the creation of connector lines comprising other metals such as Al/Cu or W. These metals usually do not require a diffusion barrier layer to prevent diffusion of metal into the structure but may instead require diffusion barriers to prevent diffusion of substances, for example fluorine, from dielectric materials into Al, Al/Cu or W. Also, metals such as Al/Cu or W may require adhesion promotion layers.

In order to fabricate metal lines, it is necessary to pattern the lines by providing an etch mask on the metal layer as shown in FIG. 2A. An IC structure such as described in connection FIG. 1A, is provided with an adhesion promoting or barrier layer 210, upon which a metal layer 212 is deposited. Using methods and materials which are well known to those of ordinary skill in the art, a mask such as a photoresist or hard mask or a combination of photoresist and hard mask, is prepared on metal layer 212 in order to subtractively etch this layer such that interconnect lines are formed on via plugs 218 and 220. Ideally, the mask should be in good alignment with the underlying via plug, as is illustrated in FIG. 2A wherein mask component 214 is in good alignment with via plug 218. However, it is difficult to dependably achieve good alignment under actual manufacturing conditions and mask misalignments, such as mask component 216 (FIG. 2A) which is misaligned with via plug 220, occur from time to time particularly in highly miniaturized IC devices. Anisotropic etching is used to form lines 222 and 224 as illustrated in FIG. 2B. Insulating layer 226 is commonly used as an etch stop. As is shown in FIG. 2B, conventional anisotropic etching techniques can result in formation of a trench 228 in via plug 220, due to misalignment between the etch mask and the underlying via plug.

Accordingly, the need exists for improved methods and materials to utilize lower resistance materials, such as Cu and Cu alloys, in IC interconnect lines. Additionally, the need exists for IC fabrication techniques which significantly reduce or overcome trench formation in a contact or a via plug due to misalignment between the interconnect line etch mask and the underlying contact or via plug.

SUMMARY OF THE INVENTION

The present invention provides novel methods and novel devices which overcome the prior art problems described above.

In one embodiment of the present invention, Cu containing interconnect lines are formed which are enclosed within Cu barrier layers. These barrier layers provide a barrier to Cu diffusion into the device and/or a barrier to substances in the dielectric which might attack the Cu lines, such as F, $H_2O$, HF or HCl. Barrier materials, such as WN are capable of providing both functions. In accordance with the embodiments of the invention, Cu lines having conventional top and bottom Cu diffusion barrier layers are formed on a substrate, such as a semiconductor substrate. Novel Cu diffusion barriers layer are formed on the side surfaces of the Cu lines having top and bottom Cu diffusion barriers. Anisotropic etching is then used to remove the barrier layer material from the insulator between the metal lines and to remove it partly or completely from the top Cu diffusion barrier layer thus forming novel Cu diffusion barrier sidewalls. The Cu lines of the present invention can be formed on one or more contact elements, such as via plugs. A dielectric gapfill material, preferably having a dielectric constant <4.2, can then be deposited on the Cu lines having the novel sidewalls. In an alternate embodiment, the Cu diffusion barrier layer is applied to the side surfaces of the Cu lines while keeping a hard mask in place on the top Cu diffusion barrier layer.

In another embodiment of the current invention, misalignment tolerant conductive lines are formed having novel sidewalls which compensate for misalignment between the line etch mask and the underlying contact. A conductive layer, such as a metal layer, is deposited on a barrier layer which is formed on the dielectric layer of a substrate, such as a semiconductor substrate, using conventional techniques. An etch mask is placed on the metal layer such that the mask patterns a line on one or more underlying contact elements, such as via plugs. The metal layer is etched, using the liner as an etch stop. Alternately, a timed etch is conducted leaving some metal on the liner. A layer comprising sidewall material is deposited on the side surfaces of the line. Anisotropic etching is used to remove the sidewall material from the liner and from the top of the line, thus forming sidewalls on the line. The novel sidewalls preferably have a thickness which equals or exceeds a misalignment gap between the mask and the contact element. However, the invention is also operable if the sidewalls of this invention are thinner than the misalignment gap because the inventive sidewall results in a reduced etching attack on the contact element compared to prior art technologies. A subsequent anisotropic etch is used to remove portions of the liner which are deposited on the insulator surface of the device, resulting in electrically isolated lines. A dielectric material, preferably having a dielectric constant <4.2, can be deposited on the structure.

In additional embodiments of the present invention, manufacturing systems are provided for forming fabricated structures, such as the IC structures of the present invention. These systems include a controller, such as a computer, which is adapted for interacting with a plurality of fabrication stations. Each of these fabrication stations performs a processing step which is utilized to fabricate the IC structures. Operative links provide connections between the controller and the manufacturing stations. A data structure, such as a computer program, causes the controller to control the processing steps which are performed at the fabrication stations. The data structure can be provided on a removable electronic storage medium.

BRIEF DESCRIPTION OF THE DRAWINGS

The details of the invention will be described in connection with accompanying drawings.

FIGS. 1A–1G are schematic cross-sectional side views illustrating prior art IC structures at sequential stages.

FIGS. 4F and 4G are schematic cross-sectional side views illustrating another embodiment of IC structures of the present invention at sequential stages.

DETAILED DESCRIPTION OF THE INVENTION

While describing the invention and its embodiments, certain terminology will be utilized for the sake of clarity. It is intended that such terminology include not only the recited embodiments but all equivalents which perform substantially the same function, in substantially the same manner to achieve the same result.

Figure 3A:
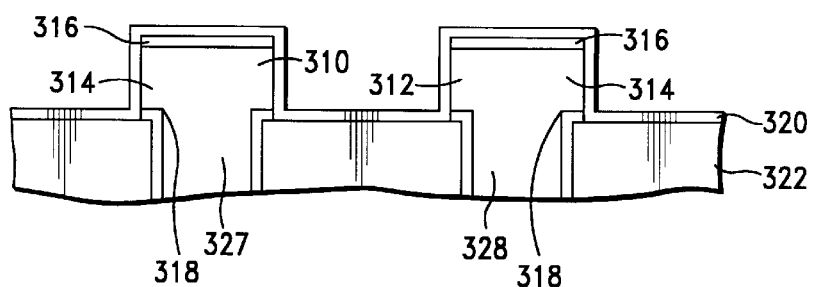
FIGS. 3A–3D are schematic cross-sectional side views illustrating an embodiment of IC structures of the present invention at sequential stages.

In one embodiment of the present invention, Cu diffusion barrier layers are employed to form novel sidewalls on the side surfaces of Cu or Cu alloy (i.e. alloys predominantly containing Cu) lines in structures, such as the IC structures schematically exemplified in FIGS. 3A–3D. The expression "IC structures" as defined herein, includes completely formed integrated circuits and partially formed integrated circuits. The structure shown in FIG. 3A illustrates an IC structure having lines 310 and 312, similar to lines 156 and 158 described in connection with FIG. 1G. Lines 310 and 312 include a layer 314 comprising Cu, Cu alloy or a mixture of Cu and Cu alloy, and top and bottom Cu diffusion barrier layers 316 and 318 respectively. These lines form Cu containing sandwich lines. Suitable materials for top and bottom Cu barrier layers 316 and 318 include CVD or PVD TiN, WN, Ta, TaN and TaSiN. Lines 310 and 312 are fabricated on Cu or Cu alloy contact elements, such as via plugs 327 and 328 respectively. Alternately, the contact elements can, for example, comprise W or Al/Cu. The various layers of the inventive structures shown in FIGS. 3A–3D are deposited by any of the methods which are well known to those of ordinary skill in the art. Suitable Cu deposition techniques include CVD, PVD, PVD with high pressure sputter reflow, electroplating and electroless plating. Examples of suitable Cu etch chemistries include conventional chlorine containing etch materials such as $CCl_2F_2$, $Cl_2$ and $SiCl_4$.

According to the present invention, a layer 320 (FIG. 3A) comprising a Cu diffusion barrier material is deposited on the exposed top and side surfaces of lines 310, 312 and on the exposed surface of dielectric layer 322. Suitable Cu barrier materials include conductors, such as CVD (chemical vapor deposition) or PVD (physical vapor deposition) TiN, WN, Ta and TaN. Suitable Cu barrier materials also include insulators such as CVD or PECVD (plasma-enhanced chemical vapor deposition) silicon nitride, $SiON_x$, SiC, amorphous carbon and spin-on materials, e.g. divinyl siloxane benzocyclobutane. It is necessary to remove layer 320 material which connects lines 310 and 312 across the insulator surface in order to prevent shorts between lines 310 and 312, if Cu barrier layer 320 includes a conductive material. Employing insulator materials, such as $Si_xN_yH_z$, $SiO_xN_y$ or SiC, for use in layer 320 may also require the removal of layer material which is deposited on insulator layer 322 between lines 310 and 312, in order to reduce cross-talk or increased capacitance which can result from the use of these materials which have a relatively high dielectric constant. Optional barrier layer techniques (not shown) include plasma or thermal treatment of the barrier layer, selectively depositing a barrier layer, e.g. W, on the Cu line side surfaces only and forming a barrier layer by thermal or plasma treatment of the side surfaces of the Cu lines. Preferably, the material of dielectric layer 322 has a dielectric constant <4.2. Suitable materials for dielectric layer 322 include $SiO_2$, $F-SiO_2$, spin-on dielectrics such as fluorinated and non-fluorinated poly(arylene) ethers (commercially known as FLARE 1.0 and 2.0, which are available from Allied Signal Company), poly(arylene) ethers (commercially known as PAE 2–3, available from Schumacher Company), divinyl siloxane benzocyclobutane (DVS-BCB) or similar products, which are well known to those of ordinary skill in the art.

Figure 3B:
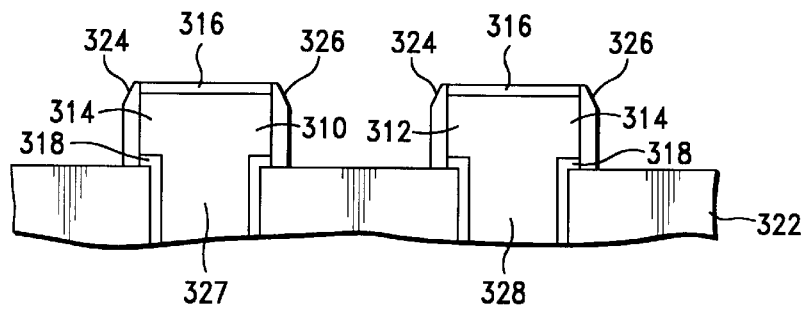

As shown in FIG. 3B, conductive or dielectric barrier layer 320 portions are removed from the surface of insulator layer 322, through anisotropic etching, without removing sidewall portions 324 and 326 of layer 320. Insulator layer 322 can be an etch stop. Preferably, the anisotropic etch is also used to remove the portion of layer 320 which covers top Cu barrier layer 316. However, it is not necessary to completely remove layer 320 from all surfaces which are substantially perpendicular to the side surfaces of the Cu lines, since any remaining layer 320 material on the top Cu barrier layer will provide an additional Cu diffusion barrier. This inventive process requires an anisotropic etch of layer 320 without removing top Cu barrier layer 316. Preferably, layers 316 and 320 have dissimilar etching characteristics to selectively etch layer 320. Alternatively, Layers 316 and 320 can be deposited such that layer 316 is significantly thicker than layer 320 in order to completely remove layer 320 between the metal lines, while leaving enough 316 material on the lines to provide a top diffusion barrier layer. This latter technique can be employed when the materials of layers 316 and 320 have similar etching characteristics, i.e. when the materials etch at substantially similar rates in a specific etch chemistry.

In an alternate embodiment (not shown), a Cu barrier layer is applied to the side surfaces of the Cu lines while keeping a hard mask in place on the top Cu diffusion barrier layer. The Cu barrier layer between the metal lines is subsequently removed by anisotropic etching as described above.

Figure 3C:
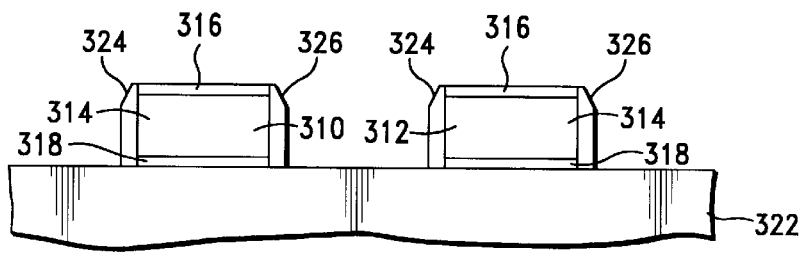

As shown in FIG. 3B, novel sidewalls 324 and 326, comprising Cu barrier layers, are created as a result of this technique. Cu or Cu alloy layer 314 of lines 310 and 312 is completely enclosed by top Cu barrier layer 316, Cu barrier sidewalls 324, 326, bottom Cu barrier layer 318 and via plugs 327 and 328. Cu containing layer 314 contacts these via plugs. Typically, the via plugs have the same composition as Cu layer 314. Cu barrier layer 318 forms a liner in the via hole. FIG. 3C illustrates portions of lines 310 and 312 which are deposited directly on dielectric layer 322 without underlying via plugs. The structure depicted in FIG. 3C shows that Cu containing layer 314 of lines 310 and 312 is completely enclosed by top and bottom Cu barrier layers 316 and 318, and by novel Cu barrier sidewalls 324 and 326.

The embodiment described in connection with FIG. 3B utilizes Cu containing via plugs. The invention is equally operable when using W plugs (not shown). It is not necessary to use a Cu barrier layer for lining the via holes when W plugs are used.

Figure 3D:
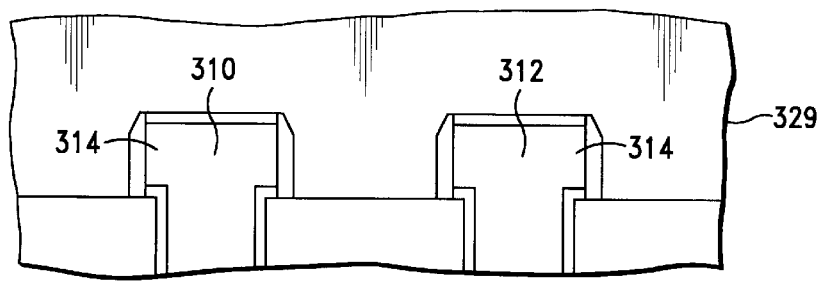

Following the fabrication of the novel Cu barrier sidewalls, as shown in FIGS. 3A–3C, insulator layer 329 can be deposited on lines 310 and 312, and on the exposed surface of insulating layer 322 (see, FIG. 3D). Complete enclosure of Cu containing layer 314 of lines 310 and 312 by top and bottom Cu barrier layers and by the novel Cu barrier sidewalls of the invention, prevent Cu diffusion into insulating layer 329 and into any part of the structure.

Figure 4A:
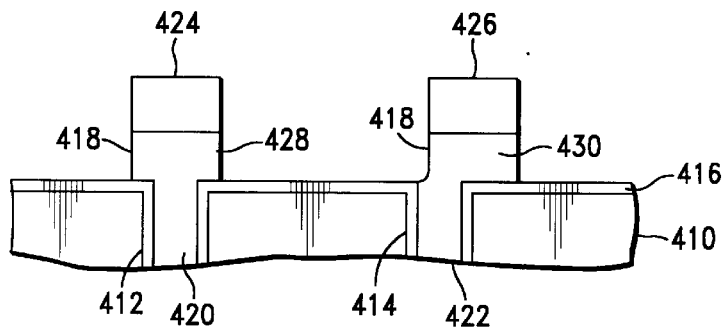
FIGS. 4A–4E are schematic cross-sectional side views illustrating another embodiment of IC structures of the present invention at sequential stages.
Figure 4B:
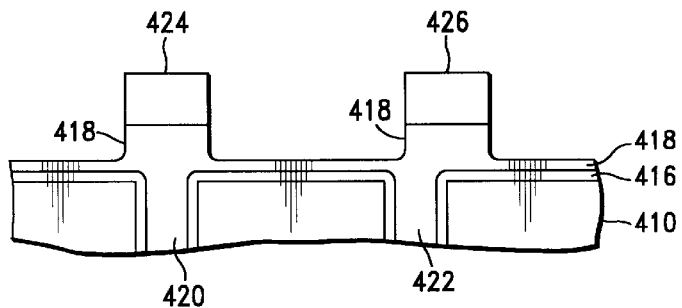

In an alternate embodiment of the present invention, novel misalignment tolerant fabrication techniques are employed to prevent trench formation in a via plug or other underlying contact element when there is misalignment between the plug and the subtractive etch mask for patterning a metallized line overlying the via plug, as shown in the structures, such as IC structures, depicted on FIGS. 4A–4G. The structure shown in FIG. 4A includes a dielectric layer 410 with via holes 412 and 414. A liner comprising barrier or adhesion promoter layer 416 is deposited on the surface of layer 410 and inside via holes 412 and 414. A metal layer 418 is deposited on layer 416 and into the via holes forming via plugs 420 and 422. Conventional etch mask components 424 and 426 are provided on metal layer 418 in order to pattern metallized lines. As shown in FIG. 4A, mask component 424 is in good alignment with underlying via plug 420, while mask component 426 is misaligned with underlying via plug 422. Suitable masks include photoresist and hard masks.

Figure 2A:
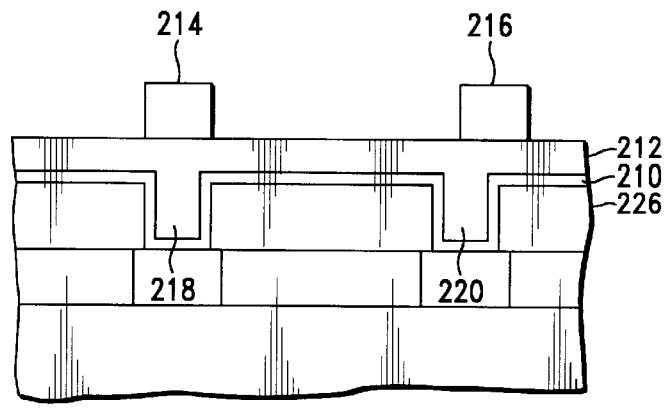
FIGS. 2A and 2B are schematic cross-sectional side views illustrating prior art IC structures at sequential stages.

Metal layer 418 is etched (FIG. 4A) using a conventional subtractive etch and using barrier layer 416 as the etch stop, thereby preventing excessive material loss in via plugs where there is significant misalignment between the mask and the via plug, such as plug 422. The subtractive etch of metal layer 418 results in the creation of etched metal lines 428 and 430 as shown in FIG. 4A. However, according to the present invention it is not necessary to completely remove all of metal layer 418 from the top surface of barrier layer 416. Incomplete removal, for example by using a conventional timed etch, is shown in the structure illustrated in FIG. 4B. Prior art technologies require complete removal of all conductive or barrier layer material between the lines to prevent shorts between the lines. This complete removal causes trenching when there is misalignment, as described above in connection with FIGS. 2A and 2B. Suitable materials for metal layer 418 include Cu, Cu alloys, Al, Al/Cu, Ag, Ag alloys and W. Suitable materials for layer 416 include Ta, TaN, TaSiN, WN, W, Ti, TiN, Cr and TiW which enables layer 416 to be an etch stop for etching metal layer 418. When metal layer 418 includes Cu, a hard mask is used in combination with a photoresist which is used to pattern the hard mask. The resist is stripped after which the hard mask pattern is transferred by anisotropic etching to form the metal lines.

Masks 424 and 426 are removed from lines 428 and 430 respectively, using conventional techniques which are well known to those of ordinary skill in the art. A sidewall layer 432 (FIG. 4C) comprising dielectric material or metal is applied to the side surfaces of lines 428, 430 and to the exposed surface of layer 416. Alternately, sidewall layer 432 is deposited on the lines and any remaining metal, such as on metal layer 418 of the structure shown in FIG. 4B. Suitable materials for sidewall layer 432 include: (1) barriers to prevent metal diffuision into dielectrics, (2) barriers to prevent attack on the metal lines by substances, such as F, diffusing from dielectric materials to the metal lines, (3) adhesion promoters to provide enhanced adhesion between the lines and any subsequently deposited dielectric or gapfill and (4) oxidation inhibitors to prevent metal oxidation. For example, a PVD or CVD WN layer 432 is an effective barrier to prevent Cu attack on the dielectric and to prevent F attack on Cu. Suitable materials for layer 432 include metals and dielectric materials. A combination of two or more materials can be used in layer 432. The various layers of the inventive structures shown in FIGS. 4A–4G are deposited by any of the methods which are well known to those of ordinary skill in the art.

Figure 4C:
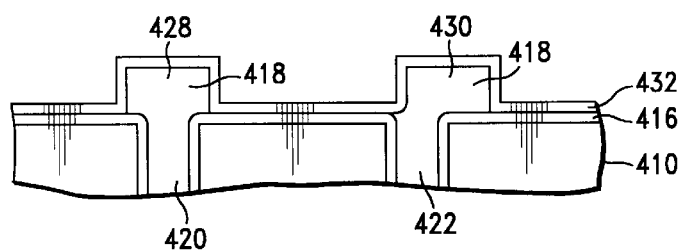
Figure 4D:
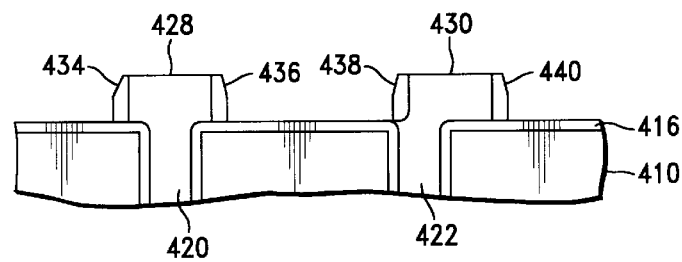

As illustrated in FIG. 4D, anisotropic etching is used to remove the portions of layer 432 on top of lines 428, 430, and to remove layer 432 between these lines. Sidewalls 434, 436 of line 428 and sidewalls 438, 440 of line 430 remain on these lines as a result of this etching process. An additional anisotropic etching step is used to remove layer 416 from the surface of insulator layer 410, resulting in electrically isolated lines 428 and 430 shown in FIG. 4E, wherein lines 428 and 430 are sidewall containing lines. The various etching techniques and etching chemistries employed in the embodiments of the present invention include techniques and chemistries which are well known to those of ordinary skill in the art.

Figure 2B:
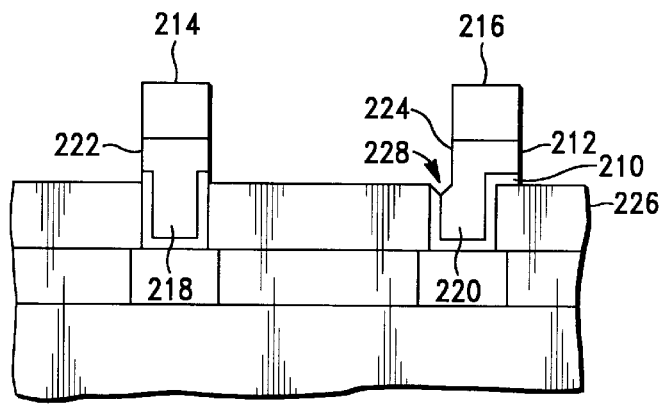
Figure 4E:
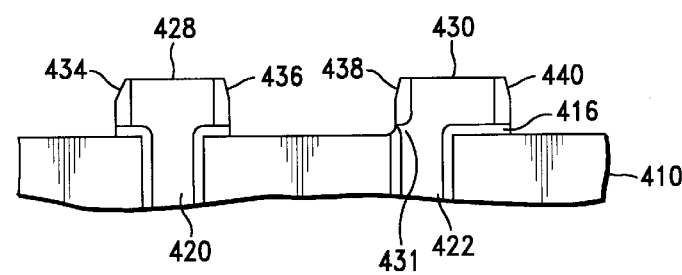

As illustrated in FIG. 4E, line 430 is misaligned with underlying via plug 422 but the novel technique of the present invention has prevented trench formation in via plug 422 which would have occurred if conventional fabrication techniques had been used (see for example prior art FIG. 2B). Trench formation is prevented because misalignment tolerant sidewall 438 of line 430 prevents etching of the underlying via plug, providing that the effective thickness of this sidewall equals or exceeds the mask misaligned gap 431 (FIG. 4E), wherein the misalignment gap represents the via plug area which would have been exposed to etching due to misalignment between the etch mask and the underlying via. Etching attack on the underlying via plug is reduced but not prevented if the effective thickness of the sidewall is less than the mask misalignment gap. The reduced etching attack results in reduced trench formation in the underlying via plug, compared with conventional techniques. As defined herein, the effective thickness of the sidewall is understood to mean the thickness of the sidewall portion which is nearest the underlying via. As defined herein, a misalignment tolerant sidewall includes a sidewall which prevents or reduces etching attack on an underlying contact element, such as a via plug, when there is a misalignment gap. As defined herein, a misalignment tolerant metal line includes a metal line having misalignment tolerant sidewalls.

Commonly used manufacturing and quality assurance information is utilized to determine the size and statistical frequency of the mask misalignment gap for any specific line fabrication process. The sidewalls of the present invention are preferably formed on the metal lines such that the effective thickness of the sidewalls equals or exceeds the mask misalignment gap. Alternately, the mask misalignment gap of a specific mask can be determined before subtractive etching to form the line, or following the subtractive etching step. Also, the mask misalignment gap can be determined by estimating the gap based on prior experience with a specific line fabrication technique.

In another embodiment of the present invention, shown in FIG. 4F, hard mask components 455 and 456 are used instead of the photoresist mask components of the structure of FIG. 4A. Combinations of photoresist and hard masks can also be utilized. In the present embodiment, these hard mask components are retained on lines 458 and 460 which are formed on barrier layer 463. The hard mask components are subsequently covered with sidewall layer 462 in a process similar to that described in connection with FIGS. 4A–4C. Anisotropic etching, such as described in connection with FIGS. 4D and 4E, is used to remove layers 462 and 463 from the surface of dielectric layer 470 (FIG. 4G), resulting in sidewalls 465, 466, 468 and 469 of lines 458 and 460 respectively. The effective thickness of misalignment tolerant sidewall 468 (FIG. 4G) exceeds the mask misalignment gap 472, thus preventing trench formation in the underlying via plug 474.

Alternatively, hard mask components can be removed prior to the deposition of a sidewall layer as described in connection with photoresist masks shown in FIG. 4C.

Structures such as those depicted in FIGS. 4E and 4F can be provided with an insulator or gapfill layer, similar to the structure shown in FIG. 3D, using materials and techniques which are well known to those of ordinary skill in the art, preferably employing dielectric materials having a dielectric constant less than 4.2.

It will be understood that it is necessary to clean or prepare the surface of the structure prior to the deposition of any layer in any subsequent fabrication step, using surface preparation methods and materials which are well known to those of ordinary skill in the art.

Figure 5:
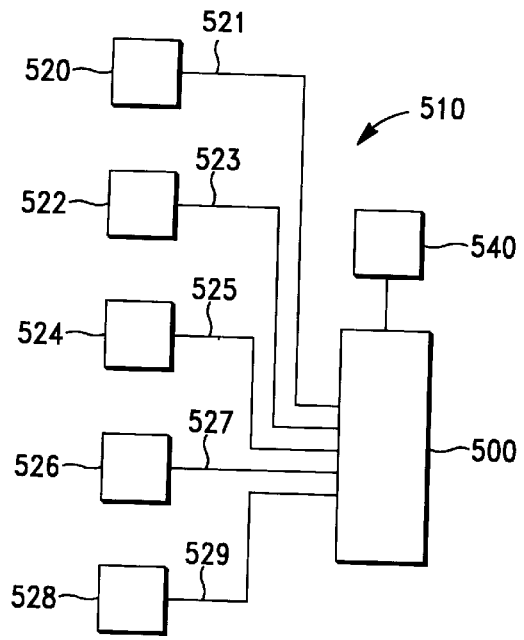
FIG. 5 is a block diagram illustrating a manufacturing system for fabricating the structures of FIGS. 3A–3D.

The novel techniques of the present invention require a sequence of processing steps. Each processing step can be performed at a fabrication station. All or some of the fabrication stations and their respective processing steps can be integrated by means of a novel apparatus including a controller 500 illustrated in FIG. 5. Controller 500 is adapted for controlling a number of fabrication stations which are utilized in the formation of fabricated structures described in connection with FIGS. 3A–3D. As illustrated in FIG. 5, a novel manufacturing system 510 for fabricating structures includes controller 500 and a plurality of fabrication stations: 520, 522, 524, 526 and 528. Additionally, system 510 has operative links 521, 523, 525, 527 and 529 which provide connections between controller 500 and fabrication stations 520, 522, 524, 526 and 528 respectively. The novel apparatus includes a data structure such as a computer program which causes controller 500 to control the processing steps at each of the fabrication stations and to, optionally, regulate the sequence in which fabrication stations are used in order to form the novel structures.

Examples of suitable controllers include conventional computers and computer systems including one or more computers which are operably connected to other computers or to a network of computers or data processing devices. Suitable computers include, but are not limited to, computers commonly known as personal computers. The data structure which is used by controller 500 can be stored on a removable electronic data storage medium 540 (FIG. 5), such as computer floppy disks, removable computer hard disks, magnetic tapes and optical disks, to facilitate the use of the same data structure at different manufacturing locations. Alternatively, the data structure can be stored on a non-removable electronic data storage medium, including a medium positioned at a location which is remote (not shown) from controller 500, using such data storage devices as are well known to those of ordinary skill in the art. The data structure can be communicated from a remote location to controller 500 using communicating techniques which are well known to those of ordinary skill in the art including hard wire connections, wireless connections and data communication methods utilizing one or more modems or techniques using one or more computers commonly known as servers. The data storage medium can be operably connected to the controller using methods and device components which are well known to those of ordinary skill in the art. Examples of suitable fabrication stations for manufacturing system 510 include the stations shown in Table A.

TABLE A

| Station | Processing Step |
|---|---|
| 520 | depositing a bottom Cu diffusion barrier layer on a dielectric layer |
| 522 | depositing a Cu containing layer on the bottom Cu barrier layer |
| 524 | depositing a top Cu diffusion barrier layer on the Cu containing layer |
| 526 | forming a Cu containing sandwich line having side surfaces |
| 528 | forming Cu diffusion barrier sidewalls on the side surfaces of the sandwich line |

Additional fabrication stations can be added to manufacturing system 510. It is also contemplated that one or more fabrication stations can be positioned at a location which is remote from the other fabrication stations in which case an additional controller or a network of controllers can be employed to control the remotely located manufacturing station.

As illustrated in FIG. 5, controller 500 is adapted to be connected to each of the manufacturing stations through operative links. Each of these links provides a bidirectional connection enabling controller 500 to transfer commands from its data structure, such as specific operating parameters, and to receive information, such as test data, from the fabrication station. The operative links can be in the form of hard wire connections or wireless connections.

Figure 6:
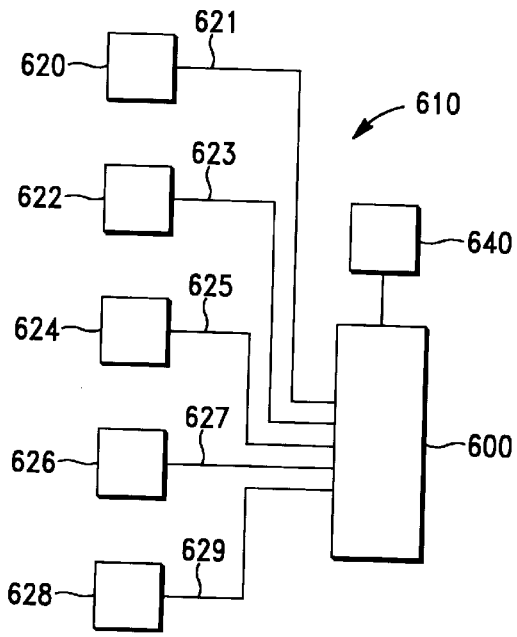
FIG. 6 is a block diagram illustrating a manufacturing system for fabricating the structures of FIGS. 4A–4G.

FIG. 6 depicts another embodiment of the present invention. A novel apparatus including controller 600 is adapted for controlling fabrication stations which are utilized in the formation of fabricated structures described in connection with FIGS. 4A–4G. Fabrication stations 620, 622, 624, 626 and 628 are connected to controller 600 through operative links 621, 623, 625, 627 and 629 respectively. The novel apparatus includes a data structure which causes the controller to control the processing steps at each of the fabrication stations. A novel manufacturing system 610 for manufacturing structures of FIGS. 4A–4G includes controller 600, the data structure, the above manufacturing stations and the operative links. The data structure can be provided on a removable electronic storage medium 640 (FIG. 6). The controller, the data structure, the operative links and the storage medium are similar to those described in connection with FIG. 5. Examples of suitable fabrication stations for manufacturing system 610 include the stations shown in Table B.

TABLE B

| Station | Processing Step |
|---|---|
| 620 | depositing a liner on a dielectric layer having a contact element therein |
| 622 | depositing a conductive layer on the liner such that the conductive layer contacts the contact element |
| 624 | depositing a line mask on the conductive layer such that the line mask overlays the contact element |
| 626 | forming a conductive line having side surfaces |
| 628 | forming misalignment tolerant sidewalls on the side surfaces |

While the embodiments of the invention regarding novel misalignment tolerant sidewalls are described and illustrated using metal interconnect lines, the invention is equally operable when conductive materials other than metals are used. These conductive materials can be used to fabricate conductive layers, similar to metal layer 418 (FIG. 4A) and to fabricate conductive lines similar to metal lines 428 and 430. Suitable conductive materials include metallic and nonmetallic superconductors, i.e. materials having zero direct current resistance at or below their superconducting transition temperature, such as nickel/germanium and yttrium/barium/copper oxides.

Suitable materials for the sidewall layers for fabricating the misalignment tolerant sidewalls of the present invention include dielectric barriers such as CVD SiN, $SiON_x$, SiC and amorphous carbon, as well as conductive materials, such as PVD Ti/TiN for Al, Al/Cu or W lines and CVD or PVD TiN, WN, Ta, TaN and TaSiN for Cu containing lines. These materials can also be used for the liners of the structure described in connection with FIG. 4A.

Typically, lines of the present invention have a height range of 0.2 to 4 $\mu$m and a width of up to 4 $\mu$m. A preferred line width range is 0.1–0.5 $\mu$m. Sidewalls of the present invention have a typical thickness range of 10–5000 Å.

While the metal lines of the present invention have typically been described and illustrated as making contact with one or more via plugs, the invention is equally operable when the metal lines make contact when one or more contact elements. A contact element as defined herein includes a conductive component which provides a low resistivity contact between the metal line and circuit elements, interconnects or semiconductor material of a structure, such as an IC structure. Suitable semiconductor materials for use in IC structures of the present invention include silicon, germanium, silicon/germanium alloys, gallium arsenide and indium/gallium/arsenide/phosphide.

The invention has been described in terms of the preferred embodiment. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims.

We claim:

1. A method of forming an interconnect line on a dielectric layer having at least one via hole therein, the method comprising:
   a) depositing a liner on the dielectric layer and inside the at least one via hole;
   b) forming a conductive via plug in the via hole;
   c) depositing a conductive layer, contacting the via plug, on the liner;
   d) depositing a line mask, overlaying the via plug, on the conductive layer;
   e) forming a conductive line having side surfaces, wherein the conductive line overlays the via plug; and
   f) forming misalignment tolerant sidewalls on the side surfaces of the conductive line, such that the sidewalls are misalignment tolerant with respect to the via plug.

2. The method of claim 1 wherein forming a conductive line comprises subtractively etching the conductive layer.

3. The method of claim 2 wherein subtractively etching comprises partially removing the conductive layer.

4. The method of claim 1 wherein forming misalignment tolerant sidewalls comprises:
   a) depositing a sidewall layer on the conductive line;
   b) anisotropically etching the sidewall layer to remove sidewall layer portions which are deposited on surfaces which are substantially perpendicular to the side wall surfaces of the conductive line; and
   c) anisotropic etching the liner to remove liner portions which are present on the dielectric layer.

5. The method of claim 1 additionally comprising determining a mask misalignment gap.

6. The method of claim 5 wherein forming misalignment tolerant sidewalls comprises:
   a) depositing a sidewall layer on the conductive line, wherein the sidewall has an effective thickness which equals or exceeds the mask misalignment gap;
   b) anisotropically etching the sidewall layer to remove sidewall layer portions which are deposited on surfaces which are substantially perpendicular to the side wall surfaces of the conductive line; and
   c) anisotropic etching the liner to remove liner portions which are present on the dielectric layer.

7. The method of claim 1 wherein forming misalignment tolerant sidewalls is preceded by removing the line mask.

8. The method of claim 1 wherein providing a line mask comprises providing a hard mask.

9. The method of claim 8 wherein forming misalignment tolerant sidewalls includes retaining the hard mask when the sidewalls are formed.

10. The method of claim 1 wherein the conductive layer comprises one or more materials selected from the group consisting of metals, alloys and superconductors.

11. The method of claim 1 wherein the conductive layer comprises one or more materials selected from the group consisting of Al, Al/Cu, Cu, Cu alloys W, Ag, Ag alloys, nickel/germanium and yttrium/barium/copper oxides.

12. The method of claim 1 wherein the via plug comprises the same material as the conductive layer.

13. The method of claim 1 wherein the sidewall comprises one or more materials selected from the group consisting of barrier materials to prevent attack by a substance on the conductive layer, diffusion barrier materials to prevent diffusion of conductive layer material, adhesion promoters to provide enhanced adhesion between the conductive layer and the dielectric layer, and oxidation inhibitors to inhibit oxidation of the conductive layer.

14. The method of claim 1 wherein the conductive layer comprises one or more materials selected from the group consisting of Cu, Cu alloys, and mixtures of Cu and Cu alloys, and wherein the misalignment tolerant sidewalls comprise Cu diffusion barrier layers.

15. The method of claim 14 wherein the misalignment tolerant sidewalls comprise one or more materials selected from the group consisting of CVD TiN, CVD WN, CVD Ta, CVD TaSiN, CVD TaN, PVD TiN, PVD WN, PVD Ta, PVD TaSiN, PVD TaN, CVD silicon nitride, PECVD $Si_xN_yH_z$, CVD $SiO_yN_x$, PECVD $SiO_yN_x$, PECVD SiC and CVD amorphous carbon.

16. The method of claim 14 additionally comprising one or more sidewall materials which prevent attack on Cu by a substance.

17. The method of claim 1 wherein the sidewalls extend to the liner.

18. A method of forming an interconnect line on a dielectric layer including at least one via hole therein, the method comprising:
   a) forming a Cu containing sandwich line on the dielectric layer, wherein (1) the sandwich line comprises: (i) a first Cu diffusion barrier layer comprising a top Cu Barrier layer, (ii) a second Cu diffusion barrier layer, comprising a bottom Cu barrier layer, formed on the dielectric layer and formed as a liner in the at least one via hole, (iii) a Cu containing layer interposed between the top Cu barrier layer and the bottom Cu barrier layer, (iv) a first side surface extending along a first side of the sandwich line and (v) a second side surface extending along a second side of the sandwich line, and wherein (2) forming a sandwich line further comprises: (i) depositing the bottom Cu diffusion barrier layer on the dielectric layer and inside the via hole, (ii) forming a conductive via plug in the via hole, (iii) depositing the Cu containing layer on the bottom Cu barrier layer and on the via plug, (iv) depositing the top Cu diffusion barrier layer on the Cu containing layer, whereby a sandwich layer is formed, (v) depositing an etch mask, patterned for forming the sandwich line, on the top Cu diffusion barrier layer such that the mask is aligned with the via plug, and (vi) subtractively etching the sandwich layer, whereby the sandwich line is formed; and
   b) forming Cu diffusion barrier sidewalls on the first and second side surfaces of the sandwich line.

* * * * *